United States Patent
Lin et al.

(10) Patent No.: US 10,818,544 B2
(45) Date of Patent: Oct. 27, 2020

(54) METHOD TO ENHANCE ELECTRODE ADHESION STABILITY

(71) Applicant: Taiwan Semiconductor Manufacturing Co., Ltd., Hsin-Chu (TW)

(72) Inventors: Hsing-Lien Lin, Hsin-Chu (TW); Chii-Ming Wu, Taipei (TW); Hai-Dang Trinh, Hsinchu (TW); Fa-Shen Jiang, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/111,605

(22) Filed: Aug. 24, 2018

(65) Prior Publication Data

US 2019/0096753 A1   Mar. 28, 2019

Related U.S. Application Data

(60) Provisional application No. 62/563,917, filed on Sep. 27, 2017.

(51) Int. Cl.
| | |
|---|---|
| *H01L 21/768* | (2006.01) |
| *H01L 49/02* | (2006.01) |
| *H01L 43/02* | (2006.01) |
| *H01L 23/535* | (2006.01) |
| *H01L 23/532* | (2006.01) |
| *H01L 21/285* | (2006.01) |

(Continued)

(52) U.S. Cl.
CPC .. *H01L 21/76843* (2013.01); *H01L 21/28568* (2013.01); *H01L 21/76805* (2013.01);
(Continued)

(58) Field of Classification Search
CPC .............. H01L 21/76843; H01L 21/28568
See application file for complete search history.

(56) References Cited

U.S. PATENT DOCUMENTS

| 5,656,852 A | 8/1997 | Nishioka et al. |
| 6,104,049 A | 8/2000 | Solayappan et al. |
| (Continued) | | |

FOREIGN PATENT DOCUMENTS

TW          515026 A    12/2002

OTHER PUBLICATIONS

King-Ning Tu, James W. Mayer, Leonard C. Feldman. "Electronic Thin Film Science for Electrical Engineering and Materials Scientists;" Chapter 2: Surface Energies, p. 38, 1st Ed., 1992.
(Continued)

*Primary Examiner* — Errol V Fernandes
(74) *Attorney, Agent, or Firm* — Eschweiler & Potashnik, LLC

(57) ABSTRACT

The present disclosure relates to an integrated circuit (IC) comprising an adhesion layer to enhance adhesion of an electrode. In some embodiments, the IC comprises a via dielectric layer, an adhesion layer, and a first electrode. The adhesion layer overlies the via dielectric layer, and the first electrode overlies and directly contacts the adhesion layer. The adhesion layer has a first surface energy at an interface at which the first electrode contacts the adhesion layer, and the first electrode has a second surface energy at the interface. Further, the first surface energy is greater than the second surface energy to promote adhesion. The present disclosure also relates to a method for forming the IC.

20 Claims, 7 Drawing Sheets

(51) Int. Cl.
*H01L 45/00* (2006.01)
*H01L 43/08* (2006.01)
*H01L 43/12* (2006.01)

(52) U.S. Cl.
CPC ...... *H01L 21/76895* (2013.01); *H01L 23/535* (2013.01); *H01L 23/53238* (2013.01); *H01L 23/53252* (2013.01); *H01L 23/53257* (2013.01); *H01L 28/65* (2013.01); *H01L 28/75* (2013.01); *H01L 43/02* (2013.01); *H01L 43/08* (2013.01); *H01L 43/12* (2013.01); *H01L 45/04* (2013.01); *H01L 45/085* (2013.01); *H01L 45/1233* (2013.01); *H01L 45/1253* (2013.01); *H01L 45/146* (2013.01); *H01L 45/16* (2013.01)

(56) References Cited

U.S. PATENT DOCUMENTS

| | | |
|---|---|---|
| 9,825,117 B2 | 11/2017 | Huang et al. |
| 2005/0012223 A1* | 1/2005 | Koller ..................... H01L 28/55 257/774 |
| 2008/0128856 A1* | 6/2008 | Kwak ................. H01L 23/5223 257/532 |
| 2010/0224878 A1 | 9/2010 | Kimura et al. |
| 2010/0233865 A1* | 9/2010 | Matsumoto ......... H01L 21/3145 438/381 |
| 2017/0213896 A1* | 7/2017 | Lisiansky ......... H01L 21/76224 |

OTHER PUBLICATIONS

Masaki et al. "Filament Formation and Erasure in Molybdenum Oxide During Resistive Switching Cycles." Applied Physics Letters, 105(17): 173504, published on Oct. 27, 2014.

Sullivan, Katie. "Flexible Solutions: Surface Energy and Pressure Sensitive Adhesives." Published Jul. 8, 2014. Retrieved online on Aug. 30, 2018 from http://blog.marianinc.com/blog/topic/surface-energy.

"Surface Energy." Published Jun. 4, 2014. Retrieved online on Aug. 30, 2018 from https://3039discovery.wordpress.com/2014/06/04/surface-energy/.

* cited by examiner

METHOD TO ENHANCE ELECTRODE ADHESION STABILITY

REFERENCE TO RELATED APPLICATION

This Application claims priority to U.S. Provisional Application No. 62/563,917, filed on Sep. 27, 2017, the contents of which are hereby incorporated by reference in their entirety.

BACKGROUND

An integrated circuit (IC) comprises a set of electronic circuits integrated together on a semiconductor substrate. During manufacture of an IC, multi-step sequences of semiconductor manufacturing processes are performed to gradually form the electronic circuits on the semiconductor substrate. Examples of such semiconductor manufacturing processes include deposition and patterning.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
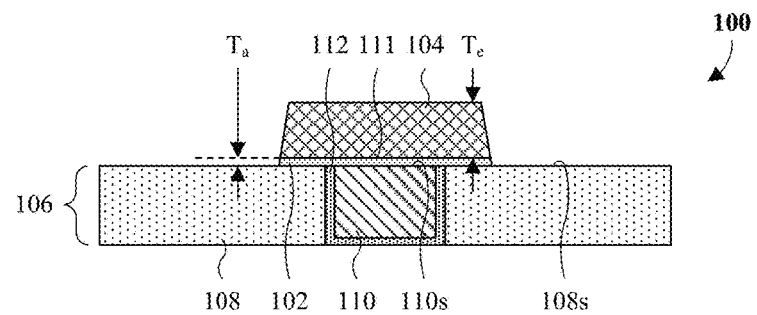
FIG. 1 illustrates a cross-sectional view of some embodiments of an integrated circuit (IC) comprising an adhesion layer to enhance adhesion of an electrode.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., an opening) may be referred to as a "first" element in some embodiments, the element may be referred to as a "second" element in other embodiments.

According to a process for forming an integrated circuit (IC), a substrate comprising a via and a via dielectric layer is provided. The via in the via dielectric layer, such that a top surface of the via is even or substantially even with a top surface of the via dielectric layer. A metal layer is deposited over and directly contacting the substrate, and is thereafter patterned to define an electrode overlying the via. The electrode may, for example, partially define a metal-insulator-metal (MIM) capacitor, a resistive random-access memory (RRAM) cell, a magnetoresistive random-access memory (MRAM) cell, a conductive-bridging random-access memory (CBRAM) cell, or some other electronic component of the IC.

The metal layer, and hence the electrode, are often silver because silver has the highest electrical conductivity of all metals. However, challenges arise when the metal layer is silver and directly contacts the substrate at a material of the substrate (e.g., monocrystalline silicon or silicon dioxide) for which silver has a comparatively high surface energy. For example, the metal layer may directly contact the substrate at silicon dioxide of the via dielectric layer. Among the challenges are adhesion stability and material migration.

Silver has a low thermal stability, whereby silver readily agglomerates at high temperatures commonly used during formation of ICs. Such high temperatures may, for example, include temperatures in excess of about 800, 1000, 1200, or 1400 degrees Celsius, and/or temperatures during back-end-of-line (BEOL) metallization processes or other processes performed during formation of ICs. Due to the high surface energy of the metal layer relative to the substrate, the metal layer has low adhesion stability with the substrate and does not sufficiently adhere to the substrate to resist agglomeration of the metal layer at the high temperatures. As such, the metal layer may agglomerate during formation of the IC, whereby voids may form in the metal layer and negatively affect electric field uniformity of the electrode. The non-uniform electric field may, in turn, lead to poor yield and/or non-uniform performance parameters during bulk manufacture of the IC. As the functional density of ICs continues to increase, electric field uniformity is expected to become increasingly important. Also due to the high surface energy, material of the metal layer may readily migrate from the metal layer into the substrate. This may, in turn, lead to a shift in parameters of semiconductor devices in the substrate by, for example, shifting doping profiles of the semiconductor devices.

In view of the foregoing, various embodiments of the present application are directed towards a method for enhancing electrode adhesion stability. In some embodiments, a substrate is provided. The substrate has a top surface with a first surface energy. A conductive adhesion layer is formed overlying and directly contacting the top surface of the substrate. The conductive adhesion layer has a top surface with a second surface energy. A first electrode layer is formed overlying the top surface of the conductive adhesion layer. The first electrode layer has a bottom surface with a third surface energy less than the second surface energy and greater than the first surface energy. Further, the bottom surface directly contacts the top surface of the conductive adhesion layer. The first electrode layer is then patterned into a first electrode.

The comparatively high surface energy of the conductive adhesion layer, relative to the first electrode layer, promotes adhesion between material of the first electrode layer and material of the conductive adhesion layer. This promotes a "wetting effect" where the first electrode material tends to disperse and fully "wet" the conductive adhesion layer. Accordingly, regardless of whether the first electrode layer is silver, the first electrode layer does not agglomerate and does not form voids. This, in turn, leads to high electric field uniformity. Further, the conductive adhesion layer may double as a diffusion barrier layer to prevent material of the first electrode layer from migrating (e.g., diffusing) to the substrate. This, in turn, prevents shifts in doping profiles of the substrate and, hence, prevents shifts in parameters of semiconductor devices. Collectively, the foregoing, may result in high yield.

With reference to FIG. 1, a cross-sectional view 100 of some embodiments of an IC with an adhesion layer 102 to enhance adhesion of a first electrode 104 to a substrate 106 is provided. As illustrated, the substrate 106 supports the adhesion layer 102 and the first electrode 104, and comprises a via dielectric layer 108. In some embodiments, the substrate 106 further comprises a first electrode via 110 recessed into a top of the via dielectric layer 108, such that a top surface 110s of the first electrode via 110 is even or substantially even with a top surface 108s of the via dielectric layer 108. The via dielectric layer 108 may be or otherwise comprise, for example, silicon oxide, silicon nitride, silicon carbide, silicon rich oxide (SRO), a low κ dielectric, some other dielectric, or any combination of the foregoing. As used herein, a low κ dielectric is a dielectric with a dielectric constant κ less than about 3.9, 3, 2, or 1. The first electrode via 110 may be or otherwise comprise, for example, tungsten, copper, aluminum copper, aluminum, some other metal, or some other conductive material.

In some embodiments, the substrate 106 further comprises additional structure (e.g., semiconductor devices, not shown) underlying the via dielectric layer 108 and the first electrode via 110. Further, in some embodiments, a first diffusion barrier layer 112 cups an underside of the first electrode via 110 to line a bottom surface of the first electrode via 110 and sidewalls of the first electrode via 110. The first diffusion barrier layer 112 blocks material of the first electrode via 110 from migrating (e.g., diffusing) outside the confines of the first electrode via 110. The first diffusion barrier layer 112 may be, for example, titanium nitride, tantalum nitride, or some other barrier material for the material of the first electrode via 110.

The adhesion layer 102 overlies the via dielectric layer 108 and, in some embodiments, the first electrode via 110. In some embodiments, the adhesion layer 102 is in direct contact with the top surface 108s of the via dielectric layer 108 and/or the top surface 110s of the first electrode via 110. Further, the adhesion layer 102 underlies and is in direct contact with the first electrode 104. The adhesion layer 102 has a first surface energy, and the first electrode 104 has a second surface energy, at an interface 111 at which the adhesion layer 102 and the first electrode 104 directly contact. The first surface energy exceeds the second surface energy to promote adhesion between the first electrode 104 and the adhesion layer 102, and so the first electrode 104 does not agglomerate and form voids during formation of the IC. This, in turn, may lead to high electric field uniformity across the first electrode 104 and high yield during bulk manufacture of the IC. Further, the adhesion layer 102 has a high thermal stability relative to the first electrode 104, such that the adhesion layer 102 does not agglomerate at temperatures used during formation of the IC.

In some embodiments, the first surface energy is about 1.5-1.7 Joules per meter squared ($J/m^2$), and the second surface energy is about 1.0-1.3 $J/m^2$. In some embodiments, the first and second surface energies are greater than a third surface energy of the via dielectric layer 108 at the top surface 108s of the via dielectric layer 108. For example, the first and second surface energies may be greater than about 1 $J/m^2$, whereas the third surface energy may be less than about 0.8 $J/m^2$. The adhesion layer 102 may be or otherwise comprise, for example, pure titanium, titanium nitride, copper, or some other conductive material with a higher surface energy than the first electrode 104. The first electrode 104 may be or otherwise comprise, for example, silver or some other metal. In some embodiments, the first electrode 104 is or otherwise comprises pure silver at the interface 111, and the adhesion layer 102 is or otherwise comprises pure titanium or titanium nitride at the interface 111. In some embodiments, the first electrode 104 is or otherwise comprises pure silver at the interface 111, and the adhesion layer 102 is or otherwise comprises copper at the interface 111.

In some embodiments, the adhesion layer 102 doubles as a diffusion barrier to prevent material of the first electrode 104 from migrating (e.g., diffusing) to the substrate 106. In some of such embodiments, this prevents shifts in doping profiles of a semiconductor devices (not shown) underlying the first electrode via 110. Preventing shifts in the doping profiles prevent shifts in parameters of the semiconductor devices, and may further increase yield during bulk manufacture of the IC. In some embodiments, the adhesion layer 102 is or otherwise comprises a transition metal or metal compound. For example, the adhesion layer 102 may include, for example, pure titanium, titanium nitride, or some other transition metal or metal compound. In some embodiments, the adhesion layer 102 is homogenous (e.g., a single material). In some embodiments, the adhesion layer 102 has a thickness $T_a$ between about 10-20 angstroms, about 25-35 angstroms, about 15-30 angstroms, about 15-22 angstroms, or about 22-30 angstroms.

In some embodiments, the first electrode 104 is or otherwise comprises an electrochemically active metal or some other metal. The electrochemically active metal may be or otherwise comprise, for example, silver (Ag) or some other electrochemically active metal. In some embodiments, the first electrode 104 is homogenous (e.g., a single material). In some embodiments, the first electrode 104 has a thickness $T_e$ between about 300-500 angstroms, about 700-900 angstroms, about 400-800 angstroms, about 400-600 angstroms, or about 600-800 angstroms. In some embodiments, the thickness $T_e$ of the first electrode 104 is between about 5-50, about 5-25, or about 25-50 times the thickness $T_a$ of the adhesion layer 102.

Figure 2:
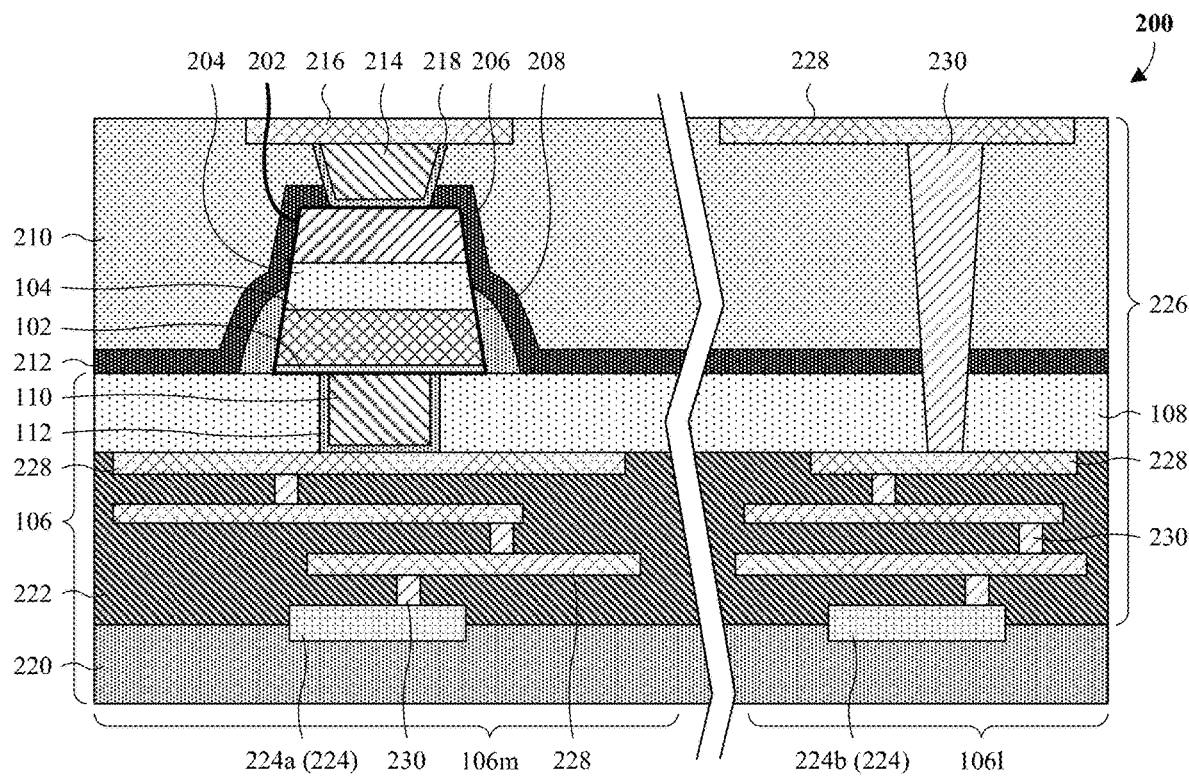
FIG. 2 illustrates a cross-sectional view of some more detailed embodiments of the IC of FIG. 1 in which the adhesion layer and the electrode are integrated into an electronic device.

With reference to FIG. 2, a cross-sectional view 200 of some more detailed embodiments of the IC of FIG. 1 is provided in which the adhesion layer 102 and the first electrode 104 are integrated into an electronic device 202. The electronic device 202 may be, for example, a RRAM cell, a MRAM cell, a CBRAM cell, a MIM capacitor, some other type of memory cell, or some other type of electronic device.

As illustrated, the electronic device 202 comprises the adhesion layer 102, the first electrode 104 overlying the adhesion layer 102, an inter-electrode element 204 overlying the first electrode 104, and a second electrode 206 overlying the inter-electrode element 204. The inter-electrode element 204 may be or otherwise comprise, for example, a dielectric layer, a data storage element, or some other material or structure. A data storage element may be, for example, a material or structure that stores a data bit (e.g., a "1" or "0") by its resistance, and that reversibly changes between a high resistance state and a low resistance state depending upon a voltage applied across the data storage element. The second electrode 206 may be or otherwise comprise, for example, platinum (Pt), iridium (Ir), gold (Au), tungsten (W), some other metal, titanium-nitride (TiN), some other conductive metal nitride, some other conductive material, or any combination of the foregoing.

In some embodiments where the electronic device 202 is a MIM capacitor, the inter-electrode element 204 is or otherwise comprises silicon dioxide, a high κ dielectric, or some other dielectric. As used herein, a high κ dielectric is a dielectric with a dielectric constant κ greater than about 3.9, 5, 10, 15, or 20. In some embodiments where the electronic device 202 is a RRAM cell, the inter-electrode element 204 comprises a dielectric layer and, in some embodiments, a capping layer overlying the dielectric layer. The dielectric layer may be, for example, silicon rich oxide (SRO), hafnium oxide, some other high κ dielectric, or some other dielectric. The capping layer may be, for example, titanium, hafnium, aluminum, or some other metal that has a high reactivity with oxygen (e.g., depends upon a high amount of energy to react with oxygen) relative to the second electrode 206. In some embodiments where the electronic device 202 is a MRAM cell, the inter-electrode element 204 is or otherwise comprises a metal tunnel junction (MTJ), and/or comprises a lower ferromagnetic plate, and dielectric layer overlying the lower ferromagnetic plate, and an upper ferromagnetic plate overlying the dielectric layer. In some embodiments where the electronic device 202 is a CBRAM cell, the inter-electrode element 204 is or otherwise comprises a solid electrolyte.

In some embodiments, a pair of spacers 208 is disposed on the via dielectric layer 108, such that the spacers 208 respectively border opposite sidewalls of the first electrode 104. For ease of illustration, only one of the spacers 208 is labeled 208. In some embodiments, the spacers 208 also border opposite sidewalls of the adhesion layer 102, respectively, and/or opposite sidewalls of the inter-electrode element 204, respectively. The spacers 208 may be or otherwise comprise, for example, silicon oxide, silicon nitride, silicon oxynitride, some other dielectric, or a combination of the foregoing.

An upper interlayer dielectric (ILD) layer 210 and, in some embodiments, a sealing layer 212 cover the via dielectric layer 108 and the electronic device 202. The sealing layer 212 conformally lines the electronic device 202 and may be, for example, silicon nitride, silicon oxide, silicon oxynitride, or some other dielectric layer. Further, the sealing layer 212 may serve as an etch stop when forming an opening for a second electrode via 214 overlying the electronic device 202. The upper ILD layer 210 overlies the sealing layer 212 when the sealing layer 212 is present. Further, the upper ILD layer 210 may be, for example, silicon oxide, silicon nitride, silicon oxynitride, a low κ dielectric, an extreme low κ dielectric, some other dielectric, or any combination of the foregoing. As herein, extreme low κ dielectric is a low κ dielectric with a dielectric constant κ less than about 2 or 1.

The second electrode via 214 extends from the electronic device 202, through the upper ILD layer 210, to a first conductive wire 216 overlying the electronic device 202 to electrically couple the electronic device 202 to the first conductive wire 216. In some embodiments, a second diffusion barrier layer 218 cups an underside of the second electrode via 214 to line a bottom surface of the second electrode via 214 and sidewalls of the second electrode via 214. The second diffusion barrier layer 218 blocks material of the second electrode via 214 from migrating (e.g., diffusing) outside the confines of the second electrode via 214. The second diffusion barrier layer 218 may be, for example, titanium nitride, tantalum nitride, or some other barrier material for the material of the second electrode via 214.

The substrate 106 underlies and supports the electronic device 202. In addition to including the via dielectric layer 108, the substrate 106 also includes a semiconductor substrate 220 and a lower ILD layer 222. The semiconductor substrate 220 and the lower ILD layer 222 are stacked under the via dielectric layer 108, such that the lower ILD layer 222 is vertically between the semiconductor substrate 220 and the via dielectric layer 108. The semiconductor substrate 220 may be, for example, a bulk silicon substrate, a silicon-on-insulator (SOI) substrate, or some other semiconductor substrate. The lower ILD layer 222 may be, for example, silicon oxide, silicon nitride, silicon oxynitride, a low κ dielectric, an extreme low κ dielectric, some other dielectric, or any combination of the foregoing.

One or more semiconductor devices 224 overlie the semiconductor substrate 220, vertically between the semiconductor substrate 220 and the lower ILD layer 222. The semiconductor device(s) 224 are recessed into a top of the semiconductor substrate 220 and may be, for example, insulated gate field-effect transistors (IGFETs), metal-oxide-semiconductor (MOS) devices, some other semiconductor devices, or any combination of the foregoing. In some embodiments, the semiconductor device(s) 224 comprise a first semiconductor device 224a underlying and electrically coupled to the electronic device 202. The first semiconductor device 224a may, for example, serve as an access device for the electronic device 202 when the electronic device 202 is one of many like devices in an array. In some embodiments, the electronic device 202 is an embedded memory cell, such that the semiconductor substrate 220 comprises a memory region 106m and a logic region 106l. In some of such embodiments, the electronic device 202 and the first semiconductor device 224a are on the memory region 106m, and a second semiconductor device 224b is on the logic region 106l.

An interconnect structure 226 is within the lower ILD layer 222, the upper ILD layer 210, and the via dielectric layer 108. The interconnect structure 226 is electrically coupled to the electronic device 202, and is further electrically coupled to the semiconductor device(s) 224. In some embodiments, the interconnect structure 226 defines a conductive path from the first semiconductor device 224a to the electronic device 202. The interconnect structure 226 comprises a plurality of conductive wires and a plurality of conductive vias. The conductive wires comprise the first conductive wire 216, and further comprise a plurality of additional conductive wires 228. For ease of illustration, only some of the additional conductive wires 228 are labeled 228. The conductive vias comprise the first electrode via 110 and the second electrode via 214, and further comprise a plurality of additional conductive vias 230. For ease of illustration, only some of the additional conductive vias 230 are labeled 230.

The conductive wires (e.g., 216 and/or 228) and the conductive vias (e.g., 110, 214, and/or 230) are stacked to define conductive paths interconnecting devices (e.g., the electronic device 202 and/or the semiconductor device(s) 224) on the semiconductor substrate 220. In some embodiments, at least some (e.g., all) of the conductive wires each provides lateral routing for the conductive paths, and/or each extends laterally from one of the conductive vias to another one of the conductive vias. Further, in some embodiments, at least some (e.g., all) of the conductive vias each provide vertical routing for the conductive paths, and/or each extends vertically from one of the conductive wires to another one of the conductive wires or a device on the semiconductor substrates 220 (e.g., the electronic device 202 and/or one of the semiconductor device(s) 224). The conductive wires and the conductive vias may be or otherwise comprise, for example, aluminum, copper, aluminum copper, tungsten, some other metal, some other conductive material, or any combination of the foregoing.

With reference to FIGS. 3-13, a series of cross-sectional views 300-1300 illustrate some embodiments of a method for forming an IC comprising an electronic device with an adhesion layer to enhance adhesion of an electrode. The adhesion layer may, for example, prevent voids in the electrode due to a high surface energy of the adhesion layer relative to the electrode. The electronic device may, for example, correspond to the electronic device 202 of FIG. 2.

Figure 3:
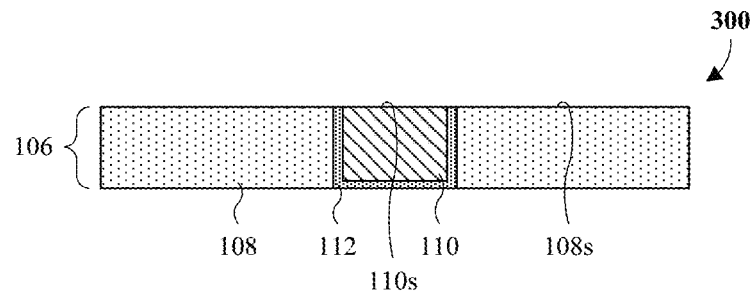
FIGS. 3-13 illustrate a series of cross-sectional views of some embodiments of a method for forming an IC comprising an electronic device with an adhesion layer to enhance adhesion of an electrode.

As illustrated by the cross-sectional view 300 of FIG. 3, a substrate 106 is provided. The substrate 106 comprises a via dielectric layer 108. Further, in some embodiments, the substrate 106 comprises a first electrode via 110 recessed into a top of the via dielectric layer 108, such that a top surface 110s of the first electrode via 110 is even or substantially even with a top surface 108s of the via dielectric layer 108. The via dielectric layer 108 may be or otherwise comprise, for example, silicon oxide, silicon carbide, silicon nitride, SRO, some other dielectric, or any combination of the foregoing. The first electrode via 110 may be or otherwise comprise, for example, tungsten, copper, aluminum copper, aluminum, some other metal, or some other conductive material.

In some embodiments, the substrate 106 comprises additional structure underlying the via dielectric layer 108. For example, as seen in FIG. 2, the substrate 106 may comprise a semiconductor substrate, one or more semiconductor devices, conductive vias, and conductive wires stacked under the via dielectric layer 108. Further, in some embodiments, a first diffusion barrier layer 112 cups an underside of the first electrode via 110, such that the first diffusion barrier layer 112 lines a bottom surface of the first electrode via 110 and sidewalls of the first electrode via 110. The first diffusion barrier layer 112 may be or otherwise comprise, for example, titanium nitride, titanium, tantalum, tantalum nitride, or some other conductive barrier material for the first electrode via 110.

Figure 4:
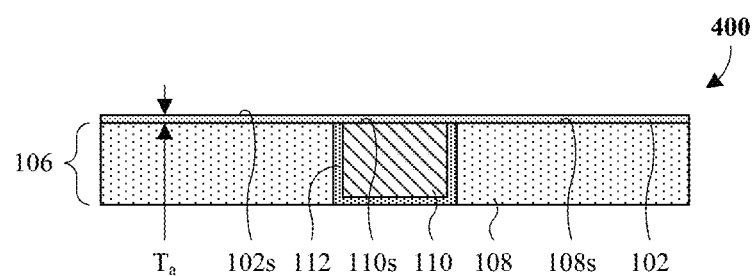

As illustrated by the cross-sectional view 400 of FIG. 4, an adhesion layer 102 is formed covering the substrate 106. Further, in some embodiments, the adhesion layer 102 directly contacts the top surface 108s of the via dielectric layer 108 and/or the top surface 110s of the first electrode via 110. The adhesion layer 102 has a first surface energy at a top surface 102s of the adhesion layer 102, and the via dielectric layer 108 has a second surface energy at the top surface 108s of the via dielectric layer 108. In some embodiments, the first surface energy exceeds the second surface energy. For example, the first surface energy may be, for example, about 1.5-1.8 $J/m^2$, about 1-1.5 $J/m^2$, or about 1.5-2.0 $J/m^2$, and/or the second surface energy may be, for example, about 0.2-0.8 $J/m^2$, about 0.6-0.8 $J/m^2$, or about 0.2-0.4 $J/m^2$. Further, the adhesion layer 102 may be or otherwise comprise, for example, pure titanium, titanium nitride, or some other conductive adhesion material, and/or may be, for example, homogenous (e.g., a single material). Further yet, the adhesion layer 102 may, for example, have a thickness $T_a$ between about 10-30 angstroms, about 5-20 angstroms, about 15-40 angstroms. In some embodiments, the adhesion layer 102 is formed by chemical vapor deposition (CVD), physical vapor deposition (PVD), or some other deposition process.

Figure 5:
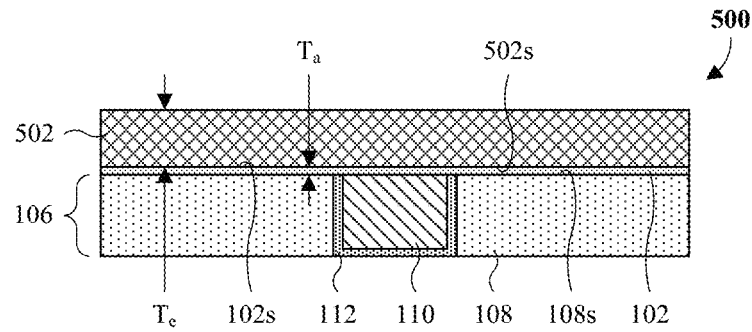

As illustrated by the cross-sectional view 500 of FIG. 5, a first electrode layer 502 is formed covering the adhesion layer 102, such that a bottom surface 502s of the first electrode layer 502 directly contacts the top surface 102s of the adhesion layer 102. The first electrode layer 502 has a third surface energy at the bottom surface 502s of the first electrode layer 502, and the adhesion layer 102 has the first surface energy at the top surface 102s of the adhesion layer 102. Further, the third surface energy is less than the first surface energy to promote adhesion between the first electrode layer 502 and the adhesion layer 102, and so the first electrode layer 502 does not agglomerate and does not form voids during formation. This, in turn, may lead to high electric field uniformity across an electrode subsequently formed from the first electrode layer 502, and/or may lead to high yield during bulk manufacture of the IC. In some embodiments, the third surface energy is about 0.8-1.2 $J/m^2$, about 1.1-1.2 $J/m^2$, or about 1.0-1.2 $J/m^2$, whereas the first surface energy is about 1.5-1.8 $J/m^2$, about 1.2-1.5 $J/m^2$, or about 1.5-2.0 $J/m^2$. Further, in some embodiments, the third surface energy is greater than the second surface energy of the via dielectric layer 108.

The first electrode layer 502 may be or otherwise comprises, for example, pure silver, silver alloy, pure copper, copper alloy, a group 10 or 11 metal, a group 10 or 11 metal compound, some other metal or metal compound, or some other metal with a surface energy less than that of the adhesion layer 102. In some embodiments, the first electrode layer 502 is pure silver or a silver alloy, and the adhesion layer 102 is pure titanium or titanium nitride. In some embodiments, the first electrode layer 502 is electrochemically active, metallurgically compatible with the adhesion layer 102, homogenous (e.g., a single material), or any combination of the foregoing. In some embodiments, the first electrode layer 502 is a material for which the adhesion layer 102 is a diffusion barrier so as to prevent material of the first electrode layer 502 from contaminating the substrate 106. The first electrode layer 502 may, for example, have a thickness $T_e$ between 200-400 angstroms, about 100-1000 angstroms, or about 400-800 angstroms, and/or that is about 5-50, about 5-25, or about 25-50 times the thickness $T_a$ of the adhesion layer 102. In some embodiments, the first electrode layer 502 is formed by a deposition process (e.g., CVD or PVD) and/or a plating process (e.g., electroplating, electro-less plating, etc.).

Figure 6:
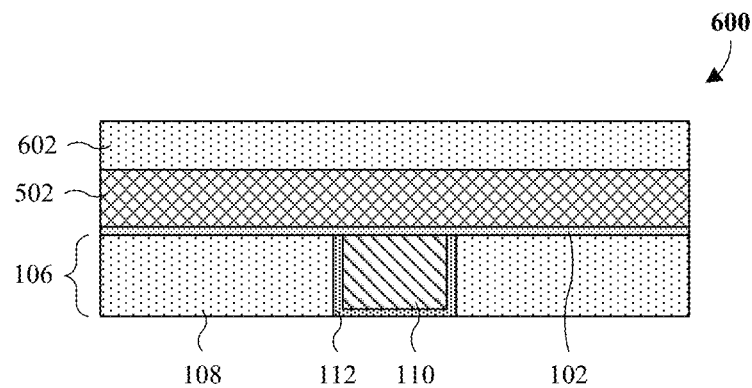

As illustrated by the cross-sectional view 600 of FIG. 6, an inter-electrode layer 602 is formed covering the first electrode layer 502. Depending upon the electronic device under manufacture, the inter-electrode layer 602 may be or otherwise comprise, for example, a dielectric layer, a data storage layer, some other functional layer, or a combination of the foregoing. For example, where the electronic device is an RRAM cell or a MIM capacitor, the inter-electrode layer 602 may be or otherwise comprise SRO, hafnium oxide, or some other high κ dielectric. As another example, where the electronic device is a MRAM cell, the inter-electrode layer 602 may be or otherwise comprise a first ferromagnetic layer, a dielectric layer overlying the first ferromagnetic layer, and a second ferromagnetic layer overlying the dielectric layer. In some embodiments, the inter-electrode layer 602 is formed by CVD, PVD, sputtering, some other deposition process, or any combination of the foregoing.

Figure 7:
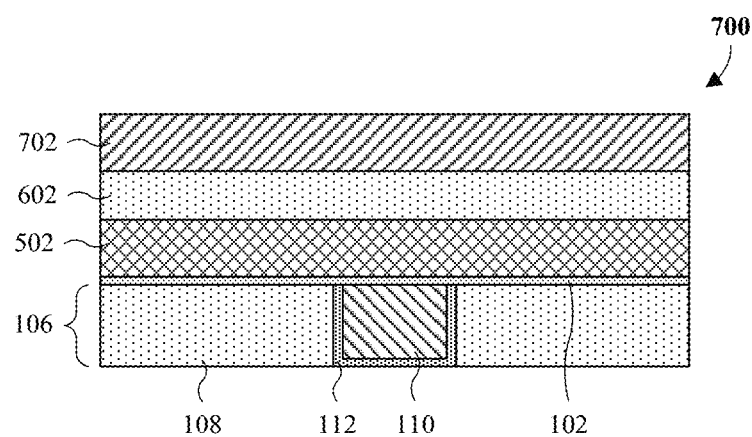

As illustrated by the cross-sectional view 700 of FIG. 7, a second electrode layer 702 is formed covering the inter-electrode layer 602. The second electrode layer 702 may be or otherwise comprise, for example, platinum (Pt), iridium (Ir), gold (Au), tungsten (W), some other metal, titanium nitride (TiN), some other conductive metal nitride, some other conductive material, or any combination of the foregoing. Further, the second electrode layer 702 may be, for example, electrochemically inert relative to the first electrode layer 502. In some embodiments, the second electrode layer 702 is formed by a deposition process (e.g., CVD or PVD) and/or a plating process (e.g., electroplating, electroless plating, etc.).

Figure 8:
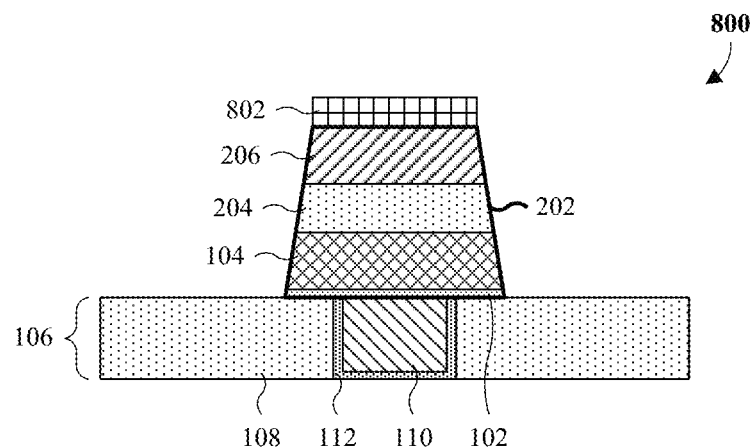

As illustrated by the cross-sectional view 800 of FIG. 8, the second electrode layer 702 (see FIG. 7), the inter-electrode layer 602 (see FIG. 7), and the first electrode layer 502 (see FIG. 7) are patterned to form an electronic device 202. In some embodiments, the adhesion layer 102 is patterned with the second electrode layer 702, the inter-electrode layer 602, and the first electrode layer 502. The electronic device 202 is localized to a device region of the substrate 106 and, in some embodiments, overlies the first electrode via 110. Further, the electronic device 202 comprises at least a portion of the adhesion layer 102, a first electrode 104 overlying the adhesion layer 102, an inter-electrode element 204 overlying the first electrode 104, and a second electrode 206 overlying the inter-electrode element 204. The first electrode 104 is formed from the first electrode layer 502, the inter-electrode element 204 is formed from the inter-electrode layer 602, and the second electrode 206 is formed from the second electrode layer 702. The patterning may, for example, be performed by an etching process or some other patterning process.

In some embodiments, a process for performing the patterning comprises forming a photoresist mask 802 on the second electrode layer 702, so as to cover and demarcate the device region of the substrate 106. For example, a photoresist layer may be deposited onto the second electrode layer 702, and subsequently patterned into the photoresist mask 802 using photolithography. One or more etchants are then applied to the second electrode layer 702, the inter-electrode layer 602, the first electrode layer 502, and the adhesion layer 102 with the photoresist mask 802 in place until the substrate 106 is exposed. Thereafter, the photoresist mask 802 may be stripped or otherwise removed.

Figure 9:
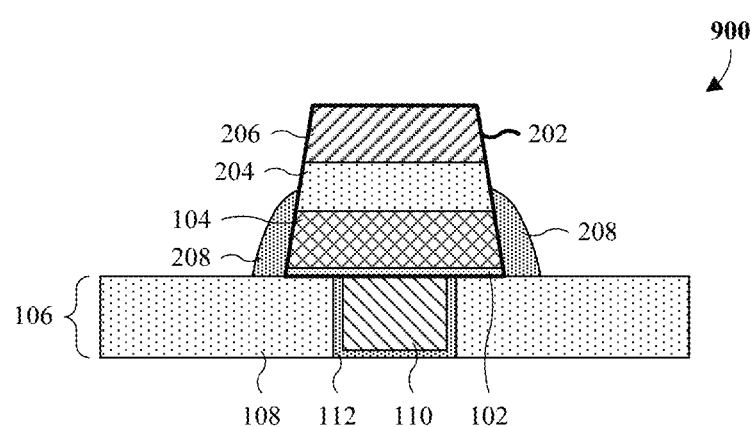

As illustrated by the cross-sectional view 900 of FIG. 9, a pair of spacers 208 is formed, such that the spacers 208 respectively line opposite sidewalls of the first electrode 104. In some embodiments, the spacers 208 also line opposite sidewalls of the inter-electrode element 204, respectively, and/or opposite sidewalls of the adhesion layer 102, respectively. Further, in some embodiments, the opposite sidewalls of the first electrode 104 are respectively even or substantially even with the opposite sidewalls of the inter-electrode element 204, and/or are respectively even or substantially even with the opposite sidewalls of the adhesion layer 102. The spacers 208 may be or otherwise comprise, for example, silicon nitride, silicon oxide, silicon oxynitride, some other dielectric, or any combination of the foregoing.

In some embodiments, a process for forming the spacers 208 comprises depositing a spacer layer covering the substrate 106 and the electronic device 202, and further lining sidewalls of the electronic device 202. The spacer layer may, for example, be formed by a conformal deposition process, and/or may, for example, be formed by CVD, PVD, or some other deposition process. An etch back is then performed into the spacer layer to remove horizontal segments of the spacer layer without removing vertical segments of the spacer layer, whereby the remaining vertical segments define the spacers 208.

Figure 10:
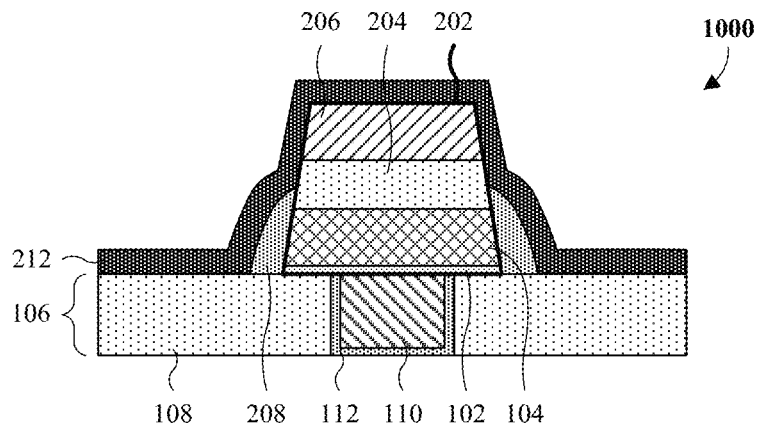

As illustrated by the cross-sectional view 1000 of FIG. 10, a sealing layer 212 is formed covering the substrate 106, the electronic device 202, and the spacers 208, and further lining sidewalls of the electronic device 202 and the spacers 208, to seal the electronic device 202. The sealing layer 212 may be or otherwise comprise, for example, silicon nitride, silicon oxide, silicon oxynitride, or some other dielectric. Further, the sealing layer 212 may, for example, be formed by a conformal deposition process, and/or may, for example, be formed by CVD, PVD, or some other deposition process.

Figure 11:
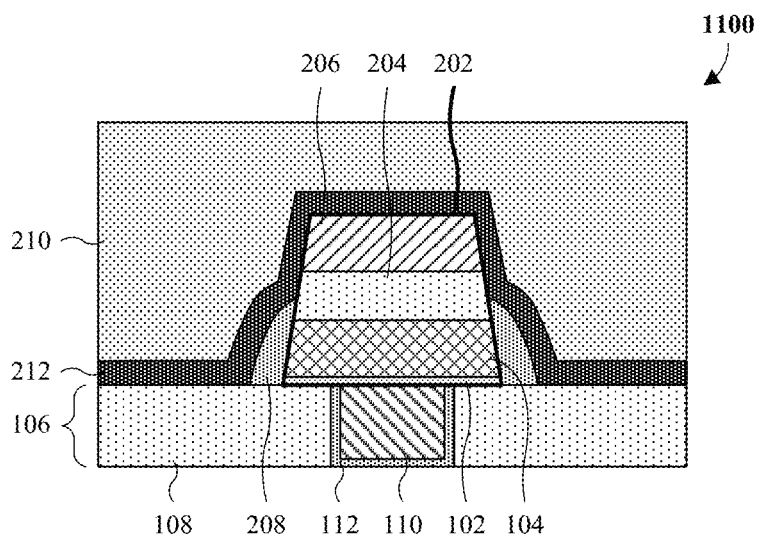

As illustrated by the cross-sectional view 1100 of FIG. 11, an ILD layer 210 is formed covering the substrate 106, the electronic device 202, the spacers 208, and the sealing layer 212, and is further formed with a top surface that is planar or substantially planar. The ILD layer 210 may be, for example, silicon oxide, silicon nitride, silicon oxynitride, a low κ dielectric, an extreme low κ dielectric, some other dielectric, or any combination of the foregoing. In some embodiments, a process for forming the ILD layer 210 comprises depositing the ILD layer 210 and subsequently performing a planarization into the top surface of the ILD layer 210. The deposition may, for example, be formed by CVD, PVD, sputtering, some other deposition process, or any combination of the foregoing. The planarization may, for example, be performed by a chemical mechanical polish (CMP) or some other planarization process.

Figure 12:
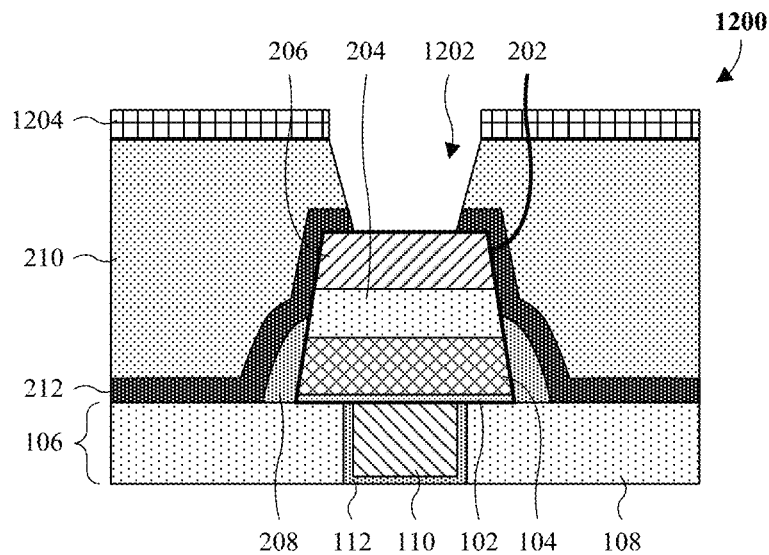

As illustrated by the cross-sectional view 1200 of FIG. 12, the ILD layer 210 and the sealing layer 212 are patterned to define a via opening 1202 overlying and exposing the second electrode 206. The patterning may, for example, be performed by an etching process or some other patterning process. In some embodiments, a process for performing the patterning comprises forming a photoresist mask 1204 on the ILD layer 210, such that the photoresist mask 1204 has a layout of the via opening 1202. For example, a photoresist layer may be deposited onto the ILD layer 210, and subsequently patterned into the photoresist mask 1204 using photolithography. One or more etchants are then applied to the ILD layer 210 and the sealing layer 212 with the photoresist mask 1204 in place until the second electrode 206 is exposed. Thereafter, the photoresist mask 1204 may be stripped or otherwise removed.

Figure 13:
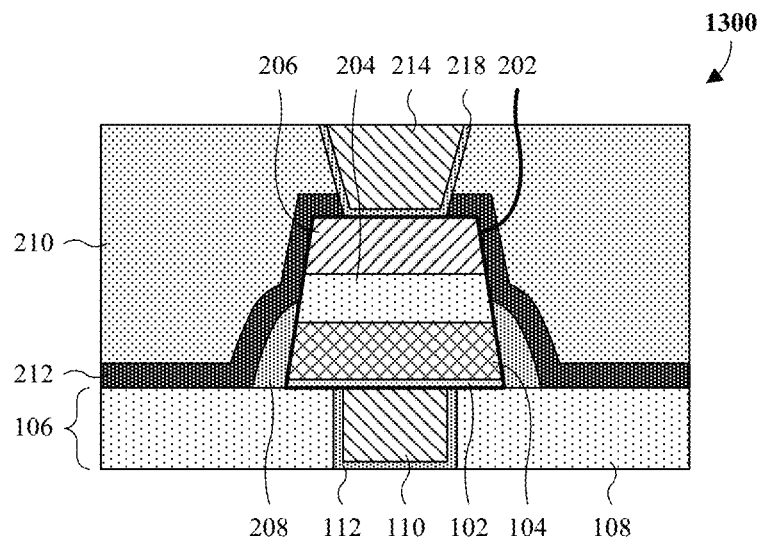

As illustrated by the cross-sectional view 1300 of FIG. 13, a second electrode via 214 is formed within the via opening 1202 (see FIG. 12). Further, in some embodiments, a second diffusion barrier layer 218 is formed lining the via opening 1202 and separating the second electrode via 214 from the ILD layer 210, the sealing layer 212, and the second electrode 206. The second electrode via 214 may be or otherwise comprise, for example, tungsten, copper, aluminum copper, aluminum, some other metal, or some other conductive material. The second diffusion barrier layer 218 may be or otherwise comprise, for example, titanium nitride, titanium, tantalum, tantalum nitride, or some other conductive barrier material for the second electrode via 214.

In some embodiments, a process for forming the second electrode via 214 comprises forming a conductive layer covering the ILD layer 210 and filling the via opening 1202. The conductive layer may be formed by, for example, CVD, PVD, sputtering, electroless plating, electroplating, or some other deposition or plating process. A planarization is then performed into the conductive layer until the ILD layer 210 is reached, thereby forming the second electrode via 214 from the conductive layer. The planarization may, for example, be performed by a CMP or some other planarization process. In some embodiments, the process further comprises forming the second diffusion barrier layer 218 covering the ILD layer 210 and conformally lining the via opening 1202. In such embodiments, the conductive layer is formed over the second diffusion barrier layer 218 and the planarization is also performed into the second diffusion barrier layer 218.

Figure 14:
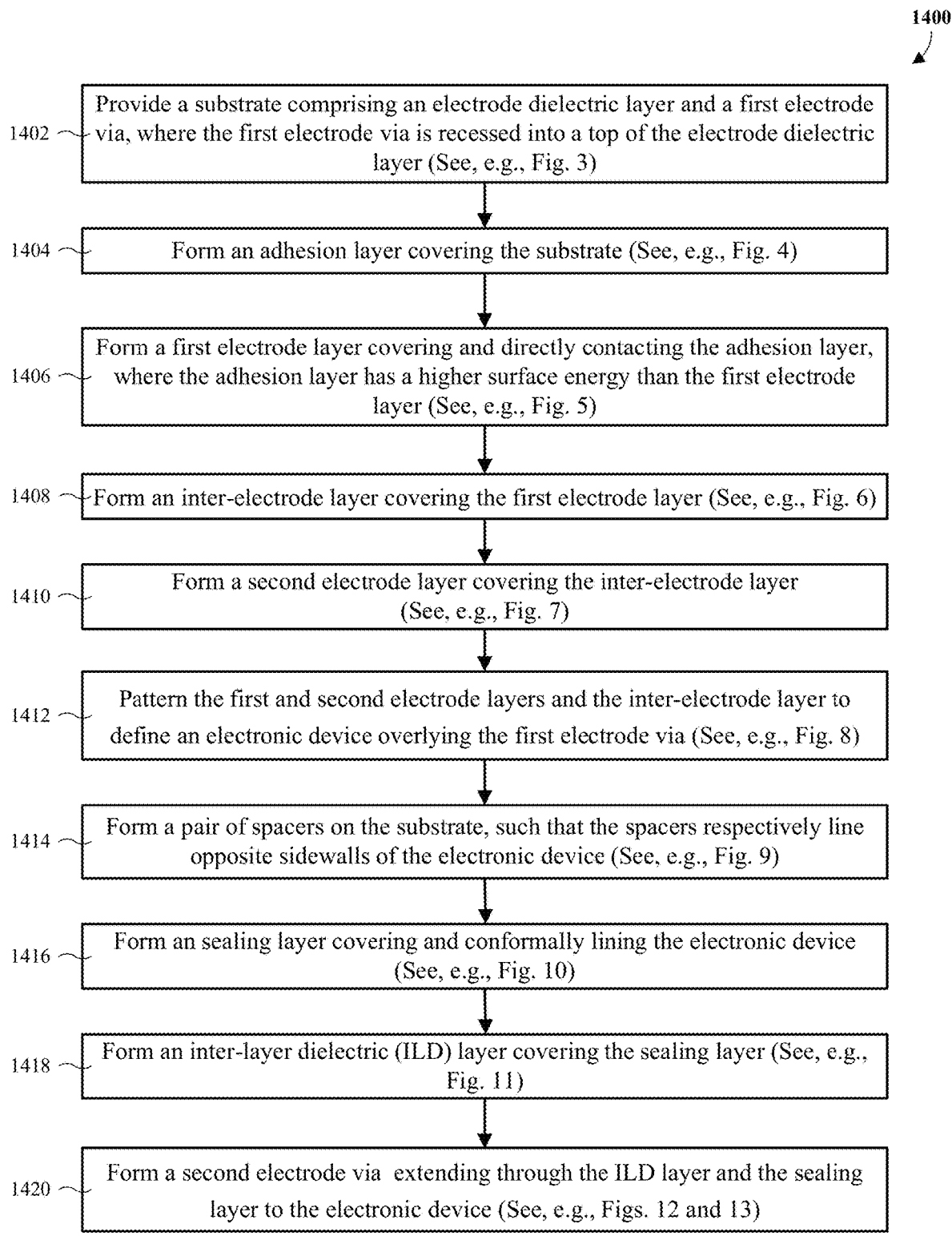
FIG. 14 illustrates a flowchart of some embodiments of the method of FIGS. 3-13.

With reference to FIG. 14, a flowchart 1400 of some embodiments of the method of FIGS. 3-13 is provided.

At 1402, a substrate comprising a via dielectric layer and a first electrode via is provided. The first electrode via is recessed into a top of the via dielectric layer, such that a top surface of the first electrode via is even or substantially even with a top surface of the via dielectric layer. See, for example, FIG. 3. In some embodiments, the first electrode via is omitted. In some embodiments, a bottom surface of the first electrode via is electrically coupled to an alternating stack of conductive wires and conductive vias underlying the first electrode via. In some embodiments, the alternating stack electrically couples the first electrode via to a semiconductor device underlying the first electrode via.

At 1404, an adhesion layer is formed covering the substrate. See, for example, FIG. 4.

At 1406, a first electrode layer is formed covering the adhesion layer, where the adhesion layer has a higher surface energy than the first electrode layer. See, for example, FIG. 5. In some embodiments, the first electrode layer has a single surface energy, and the adhesion layer has a single surface energy.

At 1408, an inter-electrode layer is formed covering the first electrode layer. See, for example, FIG. 6. The inter-electrode layer may be, for example, a dielectric layer, a data storage layer, or some other type of layer.

At 1410, a second electrode layer is formed covering the inter-electrode layer. See, for example, FIG. 7.

At 1412, the first and second electrode layers and the inter-electrode layer are patterned to define an electronic device overlying the first electrode via. See, for example, FIG. 8. The electronic device comprises a first electrode, an inter-electrode element overlying the first electrode, and a second electrode overlying the inter-electrode element. The first electrode is formed from the first electrode layer, the inter-electrode element is formed from the inter-electrode layer, and the second electrode is formed from the second electrode layer. The electronic device may be, for example, an RRAM cell, an MRAM cell, a CBRAM cell, a MIM capacitor, or some other type of electronic device.

At 1414, a pair of spacers is formed on the substrate, such that the spacers respectively line opposite sidewalls of the electronic device. See, for example, FIG. 9.

At 1416, a sealing layer is formed covering and conformally lining the electronic device. See, for example, FIG. 10.

At 1418, an ILD layer is formed covering the sealing layer. See, for example, FIG. 11.

At 1420, a second electrode via is formed extending through the ILD layer and the sealing layer to the electronic device. See, for example, FIGS. 12 and 13.

While the flowchart 1400 of FIG. 14 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present application provides a method for forming an IC, the method including: forming a via extending through a via dielectric layer; forming an adhesion layer covering the via dielectric layer and the via; and forming a first electrode layer overlying and directly contacting the adhesion layer, wherein the adhesion layer has a first surface energy at an interface at which the first electrode layer contacts the adhesion layer, wherein the first electrode layer has a second surface energy at the interface, and wherein the first surface energy is greater than the second surface energy.

In some embodiments, the present application provides an IC including: a dielectric layer; an adhesion layer overlying the dielectric layer; and a first electrode overlying and directly contacting the adhesion layer, wherein the adhesion layer has a first surface energy at an interface at which the first electrode contacts the adhesion layer, wherein the first electrode has a second surface energy at the interface, and wherein the first surface energy is greater than the second surface energy.

In some embodiments, the present application provides another method for forming an IC, the method including: forming a first via in a via dielectric layer, such that a top surface of the first via is even with a top surface of the via dielectric layer; forming a conductive adhesion layer overlying and directly contacting the top surface of the via dielectric layer and the top surface of the first via, wherein the via dielectric layer has a first surface energy at the top surface of the via dielectric layer; forming a first metal layer overlying and directly contacting the conductive adhesion layer, wherein the conductive adhesion layer has a second surface energy at an interface at which the first metal layer contacts the conductive adhesion layer, wherein the first metal layer has a third surface energy at the interface, and wherein the third surface energy is greater than the first surface energy and less than the second surface energy; forming an inter-electrode dielectric layer covering the first metal layer; forming a second metal layer covering the inter-electrode dielectric layer; patterning the first metal layer, the inter-electrode dielectric layer, and the second metal layer to define an electronic device overlying the first via; and forming a second via overlying and directly contacting the electronic device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated circuit (IC), the method comprising:
    forming a first via extending through a via dielectric layer;
    forming an adhesion layer overlying and directly contacting the via dielectric layer and the first via;
    forming a first electrode layer overlying and directly contacting the adhesion layer, wherein the adhesion layer has a first surface energy at an interface at which the first electrode layer contacts the adhesion layer, wherein the first electrode layer has a second surface energy at the interface and is formed by depositing only a single metal element directly onto the adhesion layer, and wherein the first surface energy is greater than the second surface energy;
    forming an inter-electrode layer covering the first electrode layer;
    forming a second electrode layer covering the inter-electrode layer; and
    performing an etch into the second electrode layer, the inter-electrode layer, and the first electrode layer with a common mask in place to define an electronic device overlying the first via; and
    forming a second via on and directly contacting the electronic device.

2. The method according to claim 1, wherein the adhesion layer comprises titanium or titanium nitride at the interface, and wherein the first electrode layer consists essentially of silver directly contacting the titanium or titanium nitride at the interface.

3. The method according to claim 1, wherein the adhesion layer directly contacts the via dielectric layer at a top surface of the via dielectric layer, wherein the via dielectric layer has a third surface energy at the top surface of the via dielectric layer, and wherein the second surface energy is greater than the third surface energy.

4. The method according to claim 1, wherein the adhesion layer blocks diffusion of electrode material from the first electrode layer to the via dielectric layer.

5. The method according to claim 1, wherein the inter-electrode layer is a dielectric layer, and wherein the electronic device is a metal-insulator-metal (MIM) capacitor.

6. The method according to claim 1, wherein the inter-electrode layer is a data storage layer, and wherein the electronic device is a memory cell.

7. The method of claim 1, wherein the adhesion layer is formed with a thickness between about 10 to 30 angstroms.

8. The method according to claim 1, wherein the first surface energy is between about 1.4-1.9 Joules per meter squared ($J/m^2$), and wherein the second surface energy is less than about 0.8 $J/m^2$.

9. The method according to claim 1, further comprising:
    forming an alternating stack of at least one via and at least one wire, wherein the forming of the alternating stack comprises the forming of the via, and wherein the adhesion layer is formed overlying and electrically coupled to the alternating stack through the via.

10. An integrated circuit (IC) comprising:
    a first via in a dielectric layer;
    an adhesion layer overlying the dielectric layer and the first via, wherein the adhesion layer comprises copper;
    a first electrode overlying and directly contacting the adhesion layer, wherein the adhesion layer has a first surface energy at an interface at which the first electrode contacts the adhesion layer, wherein the first electrode has a second surface energy at the interface, wherein the first surface energy is greater than the second surface energy, wherein the first electrode consists essentially of a single metal element, and wherein the single metal element is silver;
    a dielectric element overlying the first electrode;
    a second electrode overlying the dielectric element, wherein the second electrode and the dielectric element define a common sidewall that is smooth from top to bottom; and
    a second via overlying and directly contacting the second electrode.

11. The IC according to claim 10, wherein the adhesion layer directly contacts the dielectric layer at a top surface of the dielectric layer, wherein the dielectric layer comprises silicon oxide at the top surface of the dielectric layer, wherein the dielectric layer has a third surface energy at the top surface of the dielectric layer, and wherein the second surface energy is greater than the third surface energy.

12. The IC according to claim 10, wherein the adhesion layer has a thickness between about 10 to 30 angstroms.

13. The IC according to claim 10, further comprising:
    a semiconductor substrate;
    a semiconductor device in a top of the semiconductor substrate; and
    an alternating stack of at least one via and at least one wire overlying the semiconductor substrate and the semiconductor device, wherein the dielectric layer overlies the alternating stack, and wherein the alternating stack electrically couples the first electrode to the semiconductor device.

14. The IC according to claim 10, wherein a top surface of the first via is even with a top surface of the dielectric layer.

15. The IC according to claim 10, wherein the second electrode, the dielectric element, and the first electrode define an electronic device overlying the first via.

16. The IC according to claim 10, wherein the adhesion layer blocks diffusion of electrode material from the first electrode to the dielectric layer.

17. A method for forming an integrated circuit (IC), the method comprising:
    forming a first via in a via dielectric layer, such that a top surface of the first via is even with a top surface of the via dielectric layer;
    forming a conductive adhesion layer overlying and directly contacting the top surface of the via dielectric layer and the top surface of the first via, wherein the via dielectric layer has a first surface energy at the top surface of the via dielectric layer;
    forming a first metal layer overlying and directly contacting the conductive adhesion layer, wherein the conductive adhesion layer has a second surface energy at an interface at which the first metal layer contacts the conductive adhesion layer, wherein the first metal layer has a third surface energy at the interface, and wherein the third surface energy is greater than the first surface energy and less than the second surface energy;
    forming an inter-electrode dielectric layer covering the first metal layer;
    forming a second metal layer covering the inter-electrode dielectric layer;

patterning the first metal layer, the inter-electrode dielectric layer, and the second metal layer to define an electronic device overlying the first via; and forming a second via overlying and directly contacting the electronic device.

18. The method according to claim 1, wherein the first electrode layer consists essentially of a single metal element.

19. The method according to claim 18, wherein the single metal element is silver, and wherein the adhesion layer comprises titanium.

20. The method according to claim 18, wherein the single metal element is silver, and wherein the adhesion layer comprises copper.

* * * * *